US006449002B1

(12) United States Patent
Markman et al.

(10) Patent No.: US 6,449,002 B1
(45) Date of Patent: Sep. 10, 2002

(54) TRUNCATED METRIC FOR NTSC INTERFERENCE REJECTION IN THE ATSC-HDTV TRELLIS DECODER

(75) Inventors: Ivonete Markman, Carmel, IN (US); Jaehyeong Kim, Pine Brook, NJ (US); Vasudevan Parthasarathy, Irvine, CA (US)

(73) Assignee: Thomson Licensing S.A., Boulogne, Cedex (FR)

( * ) Notice: Subject to any disclaimer, the term of this patent is extended or adjusted under 35 U.S.C. 154(b) by 0 days.

(21) Appl. No.: 09/603,655

(22) Filed: Jun. 26, 2000

Related U.S. Application Data
(60) Provisional application No. 60/172,920, filed on Dec. 21, 1999.

(51) Int. Cl.[7] .................................................. H04N 5/38
(52) U.S. Cl. ..................... 348/21; 348/607; 348/608; 348/470; 375/265; 375/350
(58) Field of Search .......................... 348/21, 469, 471, 348/472, 470; 375/341, 350, 265; H04N 5/38, 7/04, 5/21

(56) References Cited

U.S. PATENT DOCUMENTS

| | | | | |
|---|---|---|---|---|
| 5,508,752 A | | 4/1996 | Kim et al. ................... 348/608 |
| 5,648,822 A | * | 7/1997 | Hulyalkr ..................... 348/607 |
| 5,787,127 A | * | 7/1998 | Ono et al. ................... 375/341 |
| 5,841,478 A | * | 11/1998 | Hu et al. ..................... 348/607 |
| 5,875,001 A | * | 2/1999 | Kwak .......................... 348/607 |
| 5,923,711 A | * | 7/1999 | Willming ..................... 375/287 |
| 6,253,345 B1 | * | 6/2001 | Agazzi et al. ............... 375/341 |

OTHER PUBLICATIONS

Dae–il oh et al., A VLSI Architecture of the Trellis Decoder Block for the Digital HDTV Grand Alliance System, IEEE Transactions on Consumer Electronics, vol. 42, No. 3, Aug. 1996, PP. 346–355.

William W. Lin et al., A Trellis Decoder for HDTV, IEEE Transactions on Consumer Electronics, vol. 45, no. 3, Aug. 1999, pp. 571–576.

* cited by examiner

*Primary Examiner*—John Miller
*Assistant Examiner*—Trang U. Tran
(74) *Attorney, Agent, or Firm*—Joseph S. Tripoli; Joseph J. Laks; Ronald H. Kurdyla

(57) ABSTRACT

In a system for receiving a signal containing digital data representing HDTV image information in the form of multilevel symbols formatted into groups of successive fields, each field comprising a field segment, a plurality of data segments, and associated sync components, the received signal is demodulated to produce a demodulated signal. The demodulated signal is comb-filtered to reject NTSC co-channel interference to produce a filtered signal. The filtered signal is trellis decoded with a trellis decoder employing a truncated non-Euclidean metric.

14 Claims, 6 Drawing Sheets

D = 1 SYMBOL DELAY FOR EACH OF THE 12 DECODERS

US 6,449,002 B1

TRUNCATED METRIC FOR NTSC INTERFERENCE REJECTION IN THE ATSC-HDTV TRELLIS DECODER

CROSS-REFERENCES TO RELATED APPLICATIONS

This nonprovisional U.S. national application, filed under 35 U.S.C. 111(a), claims, under 37 C.F.R. 1.78(a)(3), the benefit of the filing date of provisional U.S. national application No. 60/172,920, filed on Dec. 21, 1999 under 35 U.S.C. 111(b), for A Truncated Metric for NTSC Interference Rejection in the ATSC-HDTV Trellis Decoder, the entirety of which is incorporated herein by reference.

BACKGROUND OF THE INVENTION

1. Field of the Invention

The present invention relates to video system receivers which receive high definition television (HDTV) signals and, in particular, to employing a trellis decoder to decode a received VSB-modulated HDTV signal after it has been demodulated and comb-filtered to reject NTSC co-channel interference.

2. Description of the Related Art

In data transmission systems, data, such as audio and video television (TV) data, is transmitted from a transmitter to a plurality of receivers. In the field of television signal transmission system, the current NTSC (National Television Systems Committee) standard of transmission is being replaced by a higher-quality system, known as HDTV, or ATSC-HDTV standard (see United State Advanced Television Systems Committee, ATSC Digital Television Standard, Document A/53, Sep. 16, 1995). Such HDTV signals are of the VSB-modulated (Vestigial SideBand) type proposed by the Grand Alliance in the United States.

The ATSC-HDTV standard requires an 8-VSB transmission system which includes forward error correction (FEC) as a means of improving the system performance. Referring now to FIG. 1, there is shown a simplified block diagram of the FEC aspects of a HDTV transmission system 100. System 100 contains a Reed-Solomon encoder 103, followed by a byte interleaver 104, and a trellis encoder 105 on the transmitter side 101. At the receiver end 121 there is a corresponding trellis decoder 125, byte deinterleaver 124, and Reed-Solomon decoder 123.

In such a system, data signals are first encoded in accordance with a given code or encoding scheme, such as a convolutional, or trellis, code, by trellis encoder 105. The trellis code employed is rate 2/3 TCM (trellis coded modulation) code, as described in AATSC Digital Television Standard. This code is implemented by coding one bit using a rate 2, 4-state convolutional encoder, and adding an FEC uncoded bit, which is differentially precoded. Each set of three encoder output bits is then mapped to an 8-VSB modulator symbol by modulator 106, and transmitted over a given communications channel and transmission medium 150. For example, the modulated, encoded HDTV signal may be transmitted as a terrestrial RF signal through the air. The transmitted signal contains digital data representing HDTV image and other information in the form of multi-level symbols formatted into groups of successive fields, each field comprising a field segment, a plurality of data segments, and associated sync components.

The HDTV receiver 121 receives the transmitted signals. Demodulator 126 is used to demodulate the signal to provide a demodulated signal; and trellis decoder 125 is used to decode the demodulated signal to obtain the original data.

Due to the fact that NTSC and HDTV signals will coexist in the terrestrial broadcast channel for a number of years, it is important for the receiver 121 to reject possible NTSC co-channel interference. The elimination of NTSC interference may be performed by an NTSC rejection filter, also called comb filter, added to the demodulator. The comb filter is typically a 12-symbol one-tapped delay line with nulls at or near the NTSC carriers.

Thus, when the HDTV receiver detects NTSC co-channel interference, it filters the demodulated signal to remove the NTSC co-channel interference that would otherwise arise, before performing trellis decoding. In the non-NTSC interference case, to avoid unnecessary filtering and undesirable effects of such filtering, the comb filter is not applied.

When no NTSC interference is detected, the optimal trellis decoder for the AWGN (Additive White Gaussian Noise) channel is a 4-state Viterbi decoder with the Euclidean metric. See G. Ungerboeck, AChannel Coding with Multilevel/Phase Signals, *IEEE Trans. Inform. Theory*, vol. IT-28, pp. 55–67, January 1982. Thus, in performing the decoding, the trellis decoder 125 typically employs a Euclidean metric, which can provide optimal decoding when there is no NTSC interference. However, when NTSC interference is present, the use of the NTSC rejection (comb) filter introduces correlation in the noise (Additive Colored Gaussian Noise), such that the optimal trellis decoder is much more complex. Therefore, an optimal trellis decoder is typically used where there is no NTSC co-channel interference, and a partial response trellis decoder is used whenever the NTSC rejection filtering is employed. See, for example, U.S. Pat. No. 5,508,752 (Kim et al.), FIGS. 3, 6; William W. Lin et al., A Trellis Decoder for HDTV, *IEEE Trans. Consumer Electronics*, v. 45, No. 3 (August 1999), pp. 571–576, FIG. 2; and Dae-il Oh et al., A VLSI Architecture of the Trellis Decoder Block for the Digital HDTV Grand Alliance System, *IEEE Trans. Consumer Electronics*, v. 42, No. 3 (August 1996), pp. 346–356, FIG. 6.

Such systems employ 12 intra-segment interleaving (deinterleaving) in the trellis encoding (decoding), in which 12 identical encoders (decoders) are used. This permits implementing the trellis decoder 202 in the NTSC interference case as an 8-state (partial response) trellis decoder, and as a 4-state (optimal) trellis decoder 203 in the non-NTSC interference case. By employing the 12 encoder/decoder interleaving, each of the identical decoders of the trellis decoder for the NTSC interference case views the comb filter with a 1-symbol delay (instead of 12). The advantage of this architecture is that the optimal trellis decoder can be implemented with an 8-state Viterbi decoder. See United States Advanced Television Systems Committee, Guide to the Use of the ATSC Digital Television Standard, Document A/54, Oct. 4, 1995.

Referring now to FIG. 2, there is shown a block diagram illustrating the HDTV trellis decoding performed by receiver 121 of system 100 of FIG. 1, with and without NTSC interference, for each of 12 sequential decoders of trellis decoder 125. Symbol-level signal data is received from demodulator 126 (FIG. 1). In a first (NTSC interference) path, the demodulated signal is filtered by NTSC rejection (comb) filter 201, and this filtered, demodulated signal is decoded by partial response 8-state trellis decoder 202. The 8-state decoder 202 receives at its input a partial-response signal plus noise, because it is comb-filtered. This partial-response signal, which is derived from 8-VSB symbols, is also known as 15-VSB since it has 15 amplitude levels. In a second (non-NTSC interference) path, the demodulated signal is not filtered, and is decoded by optimal 4-state trellis decoder 203. Switch 204 selects the appropriate decoded signal depending on whether NTSC interference is detected.

As will be appreciated, there may be only a single trellis decoder 125 which is used to implement both 8-state trellis decoder 202 and 4-state trellis decoder 203, depending on whether demodulator 126 detects NTSC interference or not. Or, trellis decoder 125 may include separate decoders 202, 203, one of which is selected depending on whether NTSC interference is detected. Further, comb filter 201 is included in demodulator 126. It is selected, or applied, by demodulator 126 when it detects NTSC interference. Thus, when demodulator 126 detects NTSC interferences, it outputs a comb filtered, demodulated signal to decoder 125, and also instructs decoder 125 that NTSC interference has been detected so that decoder 125 can use the 8-state trellis decoder 202. Conversely, when demodulator 126 does not detect NTSC interferences, it outputs a non-comb filtered, demodulated signal to decoder 125, and does not instruct decoder 125 that NTSC interference has been detected, so that decoder 125 can use the 4-state trellis decoder 203. This functionality is illustrated in the process flow of FIG. 2.

Both the optimal 4-state trellis decoder 203, and partial response 8-state trellis decoder 202, employ the Euclidean metric or some variation of it in current implementations. In the non-NTSC interference case of decoder 204, this results in an optimal trellis decoder and optimal results, as described above. However, the 8-state trellis decoder 202 with the Euclidean metric has a performance degradation of about 3.0 to 3.75 dB with respect to the non-NTSC interference case.

DESCRIPTION OF THE PREFERRED EMBODIMENT

The present invention provides an improved metric for use with the trellis decoder of an HDTV receiver in accordance with the ATSC terrestrial broadcast standard adopted in the U.S. In particular, the present invention provides for the use of a truncated non-Euclidean trellis decoder metric when the received HDTV signal is processed by a comb filter to remove NTSC co-channel interference. As described in further detail below, the truncated metric provided herein is a suboptimal (but arbitrarily as optimal as desired) metric which provides better performance than the Euclidean metric, in the case of NTSC interference and the consequent use of a comb filter. The optimal metric for the NTSC interference case is found to be a complex, non-Euclidean metric, associated with a product of conditional probability density functions (PDFs) of the filtered noise samples. A truncated version of the optimal non-Euclidean metric is employed, in which the conditional PDFs of the optimal non-Euclidean metric are truncated to a finite small number of previous samples, m, upon which the condition applies. The truncated non-Euclidean metric is suboptimal (but arbitrarily optimal depending upon implementation tradeoffs between gain and complexity), but superior to, and different from, the Euclidean metric.

ATSC-HDTV Receiver and Trellis Decoding

Figure 3:
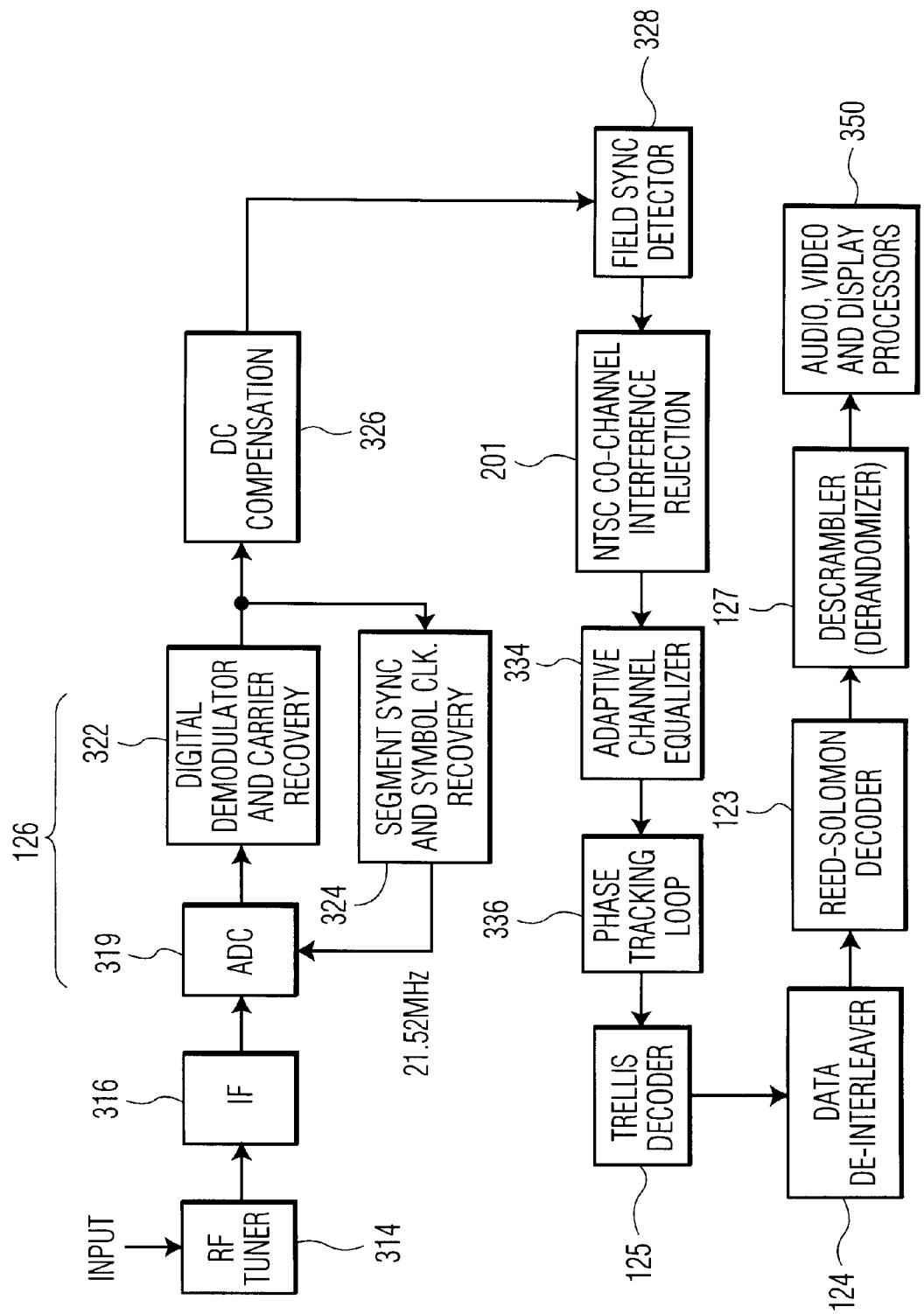
FIG. 3 is a block diagram illustrating the receiver of the system of FIG. 1 in further detail, according to a preferred embodiment of the present invention.

Referring now to FIG. 3, there is shown a block diagram illustrating receiver 121 of system 100 in further detail, according to a preferred embodiment of the present invention. Using HDTV receiver 121, a terrestrial broadcast analog input HDTV signal is processed by an input network 314 including RF tuning circuits and an intermediate frequency (IF) processor 316 including a double conversion tuner for producing an IF passband output signal, and appropriate automatic gain control (AGC) circuits. The received signal is a carrier suppressed 8-VSB modulated signal as proposed by the Grand Alliance and adopted for use in the United States. Such a VSB signal is represented by a one-dimensional data symbol constellation wherein only one axis contains quantized data to be recovered by the receiver. For simplicity of illustration, signals for clocking the illustrated functional blocks are not shown in FIG. 3.

The recovery of data from modulated signals conveying digital information in symbol form usually requires three functions at a receiver: timing recovery for symbol synchronization, carrier recovery (frequency demodulation to baseband), and channel equalization. Timing recovery is a process by which a receiver clock (timebase) is synchronized to a transmitter clock. This permits a received signal to be sampled at optimum points in time to reduce slicing errors associated with decision-directed processing of received symbol values. Carrier recovery is a process by which a received RF signal, after being frequency down converted to a lower intermediate frequency passband (e.g., near baseband), is frequency shifted to baseband to permit recovery of the modulating baseband information. Adaptive channel equalization is a process by which the effects of changing conditions and disturbances in the signal transmission channel are compensated for. This process typically employs filters that remove amplitude and phase distortions resulting from frequency dependent time variant characteristics of the transmission channel, to provide improved symbol decision capability.

Figure 4:
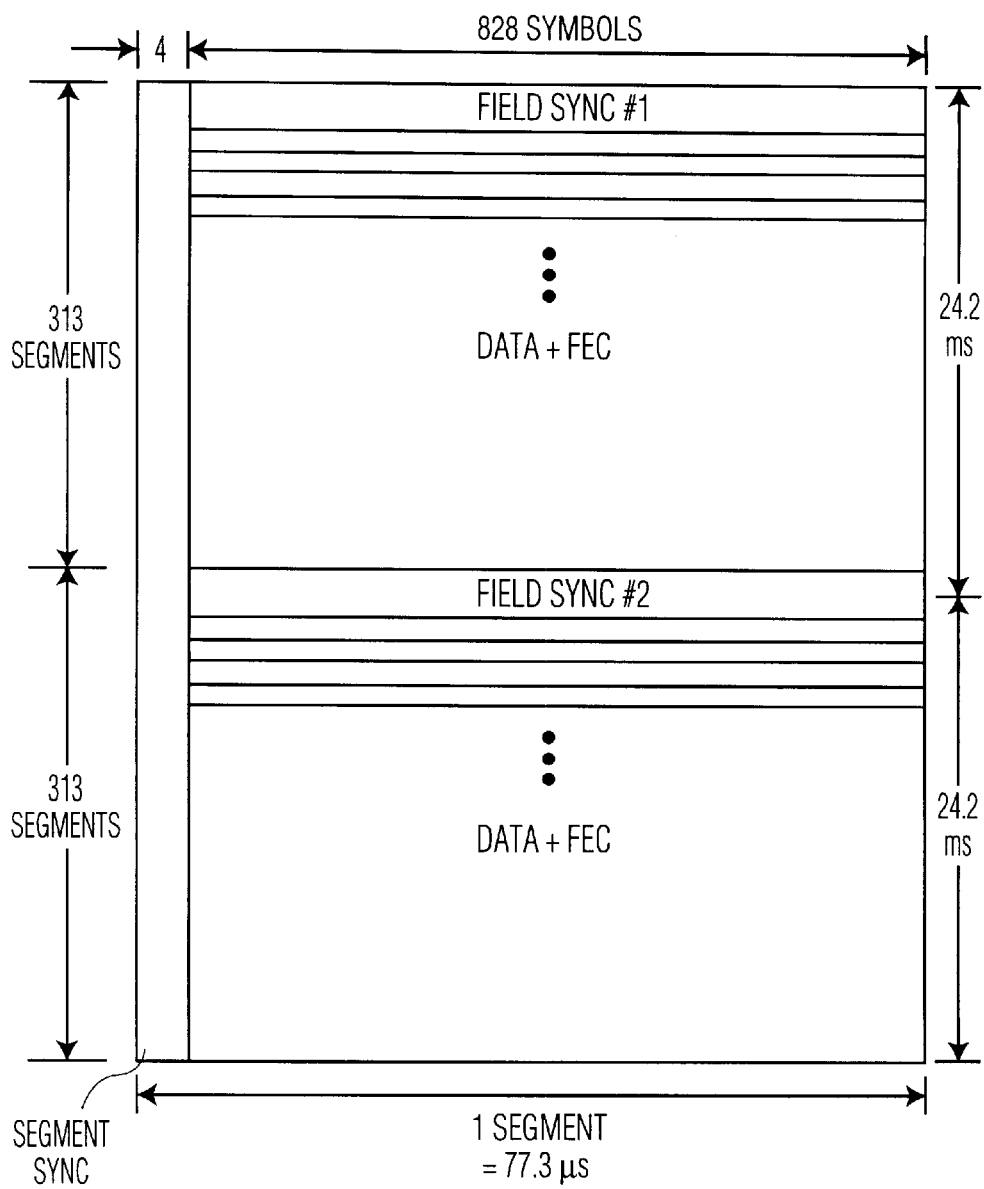
FIG. 4 depicts a data frame format for a VSB modulated signal according to the Grand Alliance HDTV system in the United States.

As described in the Grand Alliance HDTV System Specification dated Apr. 14, 1994, the VSB transmission system conveys data with a prescribed data frame format as shown in FIG. 4. Referring now to FIG. 4, there is depicted a data frame format for a VSB modulated signal according to the Grand Alliance HDTV system in the United States. A small pilot signal at the suppressed carrier frequency is added to the transmitted signal to help achieve carrier lock at a VSB receiver. As shown in FIG. 4, each data frame comprises two fields with each field including 313 segments of 832 multilevel symbols. The first segment of each field is referred to as a field sync segment, and the remaining 312 segments are referred to as data segments. The data segments typically contain MPEG-compatible data packets. (E.g., International Standards Organization (ISO) ISO/IEC 11172 Moving Pictures Experts Group-1 standard (MPEG-1); or the ISO/IEC 13818 (MPEG-2) standard.) Each data segment comprises a four-symbol segment sync character followed by 828 data symbols. Each field segment includes a four-symbol segment sync character followed by a field sync component comprising a predetermined 511 symbol pseudorandom number (PN) sequence and three predetermined 63-symbol PN sequences, the middle one of which is inverted in successive fields. A VSB mode control signal (defining the VSB symbol constellation size) follows the last 63-symbol PN sequence, which is followed by 96 reserved symbols and 12 symbols copied from the previous field.

Referring once more to FIG. 3, the passband IF output signal from IF unit 316 is converted to an oversampled digital symbol datastream by an analog-to-digital converter (ADC) 319. The output oversampled digital datastream from ADC 319 is demodulated to baseband by an all digital demodulator/carrier recovery network 322. This is done by an all digital phase locked loop (PLL) in response to the small reference pilot carrier in the received VSB datastream. Unit 322 produces an uotput I-phase demodulated symbol datastream, as will be appreciated by those skilled in the art.

ADC 319 oversamples the input 10.76 MSymbols/sec VSB symbol datastream with a 21.52 MHz sampling clock, i.e., twice the received symbol rate, thereby providing an oversampled 21.52 MSamples/sec datastream with two samples per symbol. The use of such two sample per symbol sample based processing, rather than symbol-by-symbol (one sample per symbol) symbol based processing, produces advantageous operation of subsequent signal processing functions such as are associated with DC compensation unit 326 and the NTSC interference detector of demodulator 126, for example.

Associated with ADC 19 and demodulator 22 is a segment sync and symbol clock recovery network 324. Network 24 detects and separates the repetitive data segment sync components of each data frame from the random data. The segment syncs are used to regenerate a properly phased 21.52 MHz clock which is used to control the datastream symbol sampling by ADC 319. As will be appreciated, network 324 advantageously uses an abbreviated two-symbol correlation reference patter and associated two-symbol data correlator to detect the segment sync.

A DC compensation unit 326 uses an adaptive tracking circuit to remove from the demodulated VSB signal a DC offset component to the pilot signal component. Unit 28 detects the data field sync component by comparing every received data segment with an ideal field reference signal stored in memory in the receiver. In addition to field synchronization, the field sync signal provides a training signal for channel equalizer 334.

NTSC interference detection and rejection are performed by unit 201 of demodulator 126. Afterwards, the signal is adaptively equalized by channel equalizer which may operate in a combination of blind, training, and decision-directed modes. Equalizer 334 may be of the type described in the Grand Alliance HDTV System Specification and in an article by W. Bretl et al., AVSB Modem Subsystem Design for Grand Alliance Digital Television Receivers, *IEEE Trans. Consumer Electronics*, August 1995. The output datastream from comb filter 201 is downconverted to a one sample/symbol (10.76 MSymbols/sec) datastream prior to equalizer 334. This downconversion may be accomplished by a suitable downsampling network (not shown to simplify the drawing).

Figure 1:
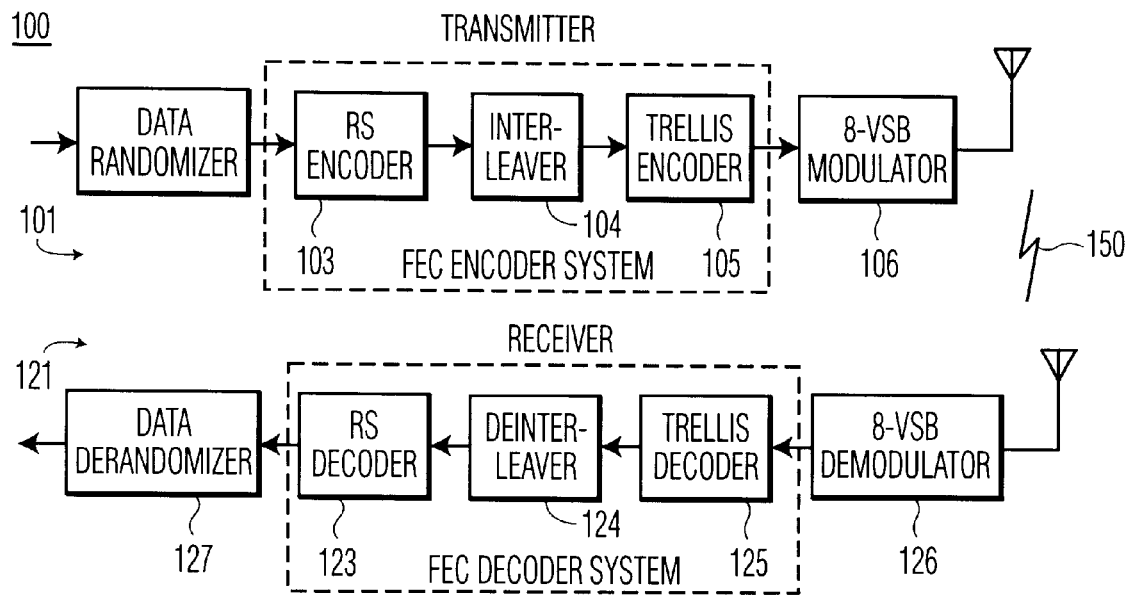
FIG. 1 is a simplified block diagram of the FEC aspects of an HDTV transmission system.

Equalizer 334 corrects channel distortions, but phase noise randomly rotates the symbol constellation. Phase tracking network 336 removes the residual phase and gain noise in the output signal from equalizer 334, including phase noise which has not been removed by the preceding carrier recovery network in response to the pilot signal. All of the components shown in FIG. 3 before trellis decoder 125, namely units 314, 316, 319, 322, 324, 326, 328, 201, 334, and 336, are represented by the demodulator block 126 of FIG. 1.

The phase corrected signal output by phase tracking network 336 of demodulator 126 is then trellis decoded by unit 125, de-interleaved by unit 124, Reed-Solomon error corrected by unit 123, and descrambled (de-randomized) by unit 127. Afterwards, a decoded datastream is subjected to audio, video, and display processing by unit 350.

Tuner 314, IF processor 316, field sync detector 328, equalizer 334, PLL 336, trellis decoder 125, de-interleaver 124, Reed-Solomon decoder 123, and descrambler 127 may employ circuits of the type described in the Grand Alliance HDTV System Specification of Apr. 4, 1994, and in the Bretl et al. article mentioned above. Circuits suitable for performing the functions of units 319 and 350 are well-known.

Demodulation in unit 322 is performed by an all digital automatic phase control (APC) loop to achieve carrier recovery. The PLL uses the pilot component as a reference for initial acquisition and a normal phase detector for phase acquisition. The pilot signal is embedded in the received datastream, which contains data exhibiting a random, noise-like pattern. The random data is essentially disregarded by the filtering action of the demodulator APC loop. The 10.76 MSymbol s/sec input signal to ADC 319 is a near baseband signal with the center of the VSB frequency spectrum at 5.38 MHz and the pilot component situated at 2.69 MHz. The input datastream is advantageously two-times oversampled by ADC 319 at 21.52 MHz. In the demodulated datastream from unit 322 the pilot component has been frequency shifted down to DC.

Figure 2:
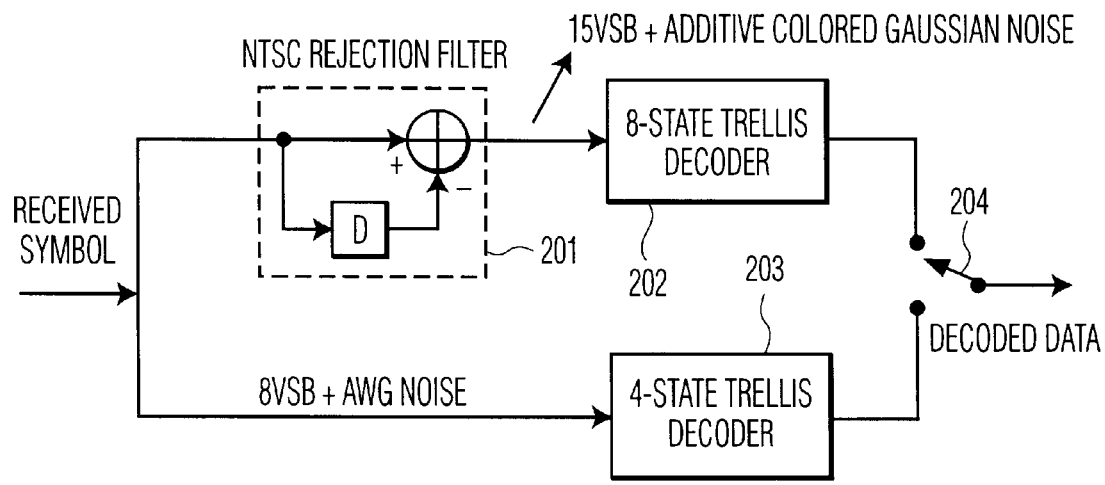
FIG. 2 is block diagram illustrating the HDTV trellis decoding performed by the receiver of the system of FIG. 1, with and without NTSC interference, for each of 12 sequential decoders of the trellis decoder.

In an embodiment, demodulator 126 performs demodulation with digital demodulation unit 322 and, when it detects NTSC co-channel interference, it activates comb filter 201 to perform NTSC co-channel interference rejection; otherwise, comb filter 201 is inactive and does not filter the signal. As explained above with reference to FIG. 2, trellis decoder unit 125 can implement both the optimal 4-state trellis decoder 203 used in the non-NTSC interference case, and the partial response 8-state trellis decoder 202 used in the NTSC interference case. The optimal trellis decoder 203 of trellis decoder 125 employs a Euclidean metric, and the partial response trellis decoder 202 of trellis decoder 125 employs a truncated, non-Euclidean, suboptimal metric in accordance with the present invention, as described in further detail below.

Optimal Non-Euclidean Metric for NTSC Interference Case

The present invention provides for a family of metrics, referred to herein as a truncated metric, which is more suited than the Euclidean metric for the NTSC interference case.

By configuring partial response trellis decoder 202 to employ a truncated metric in accordance with the present invention, increasing performance is permitted with increased complexity. As described below, two relatively simple embodiments of the truncated metric permit gains of 1.0 dB and 1.5 dB with respect to the Euclidean metric and relatively easy implementations.

As explained above, in an ATSC-HDTV trellis decoder in accordance with the ATSC-HDTV standard, the Euclidean metric is not optimal when NTSC interference is present, due to the correlated noise introduced when the NTSC rejection filter 201 is applied to reject the detected NTSC co-channel interference, as seen from the following discussion.

Figure 5:
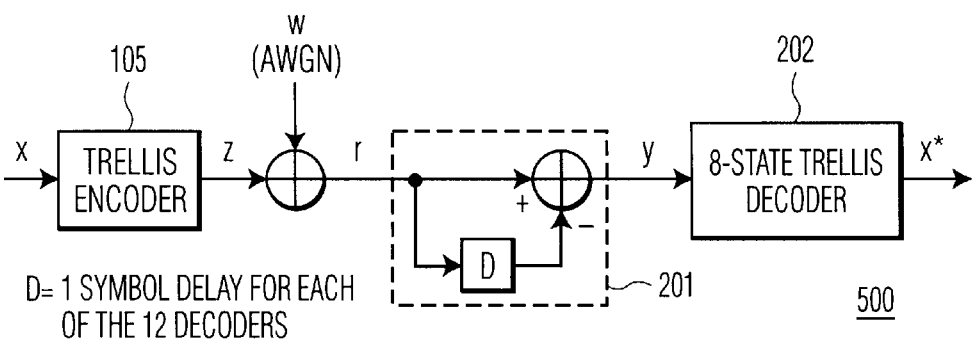
FIG. 5 is a simplified block diagram illustrating an aspect of the HDTV transmission system of FIG. 1 for determining the optimal non-Euclidean metric for the NTSC interference case.

In order to derive the optimum metric of the partial response trellis decoder, it is useful to first analyze the partial response signal. Referring now to FIG. 5, there is shown a simplified block diagram 500 illustrating an aspect of the HDTV transmission system of FIG. 1 for determining the optimal non-Euclidean metric for the NTSC interference case. Illustrated in FIG. 5 are trellis encoder 105 of transmitter 101 of system 100, comb filter 201 of demodulator 126 (FIGS. 1, 2), and the 8-state partial response trellis decoder 202 of decoder 125 (FIGS. 1,2) which is employed by receiver 121 in the NTSC interference case. In the diagram illustrated in FIG. 5, x is the data input sequence; z is the encoder output sequence, transmitted sequence, or codeword; w is the AWGN noise sequence; r is the received sequence; y is the rejection filter output sequence, and x* is the decoded data sequence. For each sample i, the following relations will hold:

$$r_i = z_i + w_i$$

$$dz_i = z_i - z_{(i-1)}$$

$$dw = w_i - w_{(i-1)}$$

$$y_i = r_i - r_{(i-1)} = dz_i + dw \quad (1)$$

From Eq. (1), it is seen that the trellis decoder 202 receives at its input a partial response signal $dz_1$ plus noise. This partial response signal derived from 8-VSB symbols is also known as 15-VSB, since it has 15 possible amplitude levels.

The multidimensional Gaussian probability density function (PDF) of the $dw^n$ stochastic sequence of length n is defined as shown in Eq. (2):

$$p_{dw}(dw^n) = p(dw_1)p(dw_2/dw_1)p(dw_3/dw_2dw_1) \quad (2)$$

$$\ldots p(dw_n/dw_{n-1} \ldots dw_1)$$

$$= \{1/((2\pi)^{n/2}(det[K_{dw}])^{1/2})\}EXP\{-[dw^n]^T K_{dw}^{-1} dw^n/2\}$$

where det[.] represents the matrix determinant, $[.]^T$ is the matrix transpose, $K^{-1}$ represents the matrix inverse of K and K is the covariance matrix of the noise sequence $dw^n$ of length n. See Henry Stark & John W. Woods, *Probability, Random Processes, and Estimation Theory for Engineers*, 2nd ed. (Englewood Cliffs, N. J.: Prentice Hall, 1994).

By applying the Maximum Likelihood (ML) decision rule to the PDF in Eq. (2), we derive the optimum metric, given by:

$$\mu^n = [y^n - dz^n]^T K_{dw}^{-1} [y^n - dz^n] \quad (3)$$

Due to the noise correlation introduced by the comb filter in the NTSC interference case, the covariance matrix of the stochastic Gaussian noise sequence is not a scaled version of the identity matrix, as in the case of non-NTSC interference. See the Stark & Woods text referenced above. In addition, the inverse covariance matrix, $K^{-1}$, will be a n×n matrix with non-zero coefficients. Therefore, the optimal metric is not the Euclidean metric, and also increases in complexity as the sequence length n increases. Thus, the optimal metric for the NTSC interference case can be very complex.

Truncated (Sub-Optimal) Non-Euclidean Metric for NTSC Interference Case

In an embodiment, instead of the optimal non-Euclidean metric represented by Eq. (3), a truncated, suboptimal metric based on the optimal non-Euclidean metric is employed by trellis decoder 202 during decoding. In particular, the truncated metric is obtained by truncating the conditional PDFs of the optimal non-Euclidean metric to a finite small number of previous samples, m, upon which the condition applies. The set of truncated metrics used for the NTSC interference case are derived when the noise correlation is truncated to a small number of adjacent noise samples. As an example, for m=0, all conditional PDFs are replaced by $p(dw_i)$, for each value of i #n; for m=1, they are replaced by $p(dw_i/dw_{i-1})$, for each value of i #n; for m=2, they are replaced by $p(dw_1/dw_{1-1} dw_{1-2})$, for each value of i #n, and so on.

For a general value of the truncation metric, m, the truncated metric is given by:

$$\mu^n = \sum_{i=1}^{n} \mu_i = \sum_{i=1}^{n} \left( \sum_{j=0}^{m} (1 - j/(m+1)) dw_{i-j} \right)^2 \Bigg|_{dw = y - dz} \quad (4)$$

where n is the sequence length; m is the truncation constant (m #n); y is the received partial response symbol plus correlated noise; dz is the partial response symbol; dw is the correlated noise and $dw_{-m+1} = \ldots = dw_{-1} = dw_0 / 0$. Thus, the family of truncated metrics of an embodiment of the present invention is given by Eq. (4).

Eq. (4) has a simple repetitive structure as n increases and it approaches the optimum metric as m6n. The complexity also increases as m increases: the number of metric terms stored and the number of adders per trellis state are equal to m. However, for sequences of length n, the brute-force complexity per state will be proportional to n*m, instead of the $n^2$ necessary for the optimum metric. Therefore, choosing a small enough truncation constant m makes it very attractive for practical implementations. As will be appreciated, the implementation of the truncated metric of the present invention by trellis decoder 202 is similar to the implementation of the absolute-Euclidean metric employed in previous HDTV trellis decoders, with proper adjustments for the need to store previous metric terms.

Alternative Truncated Metrics

In addition to the truncated metric of Eq. (4), in alternative embodiments variations of the truncated metric may also be employed, such a the absolute-truncated metric, the power-of-two-coefficient metric, and the absolute-power-of-two-coefficient metric. These metrics permit easy practical implementations, while keeping the relative gains achieved by using the embodiment of the truncated metric described above with reference to Eq. (4). These variations of the truncated metric are described below.

Absolute-Truncated Metric

Although the Euclidean metric has a square term, one approximation often made when implementing Viterbi decoders is to define as the metric the absolute value of the term to be squared. This simplifies the size of the metric, and eliminates the need for a multiplier per state, or a ROM, at the cost of some additional degradation. In an alternative embodiment, a similar absolute value technique is applied to the truncated metric of Eq. (4), to result in a truncate metric referred to herein as an absolute-truncated metric, where Eq. (4) becomes:

$$\mu^n = \sum_{i=1}^{n} \mu_i = \sum_{i=1}^{n} \left| \sum_{j=0}^{m} (1 - j/(m+1))dw_{i-j} \right| \Bigg|_{dw=y-dz} \quad (5)$$

A more practical version of Eq. (5) will eliminate the need for fractional coefficients, transforming it in integers. Without loss in performance, but requiring more bits, the absolute-truncated metric can be written as:

$$\mu^n = \sum_{i=1}^{n} \mu_i = \sum_{i=1}^{n} \left| \sum_{j=0}^{m} (m+1-j)dw_{i-j} \right| \Bigg|_{dw=y-dz} \quad (6)$$

Power-of-Two-Coefficient Metric

One disadvantage of the truncated metric of Eq. (4), or absolute-truncated metrics for m>1, is the need for fractional coefficients which are not a power of 2 or, as in Eq. (6), an increased number of bits per metric term in order to eliminate the fractional coefficients. Therefore, in another alternative embodiment, a variation of the truncated metric is employed for which the fractional coefficients are only powers of two, which can be easily implemented by shift registers. Thus, in one embodiment, the following power-of-two-coefficient metric may be employed:

$$\mu^n = \sum_{i=1}^{n} \mu_i = \sum_{i=1}^{n} \left( \sum_{j=0}^{m} (1/2)^j dw_{i-j} \right)^2 \Bigg|_{dw=y-dz} \quad (7)$$

or its equivalent absolute metric:

$$\mu^n = \sum_{i=1}^{n} \mu_i = \sum_{i=1}^{n} \left| \sum_{j=0}^{m} (1/2)^j dw_{i-j} \right| \Bigg|_{dw=y-dz} \quad (8)$$

In another alternative, the truncated metric coefficients in Eq. (4) are replaced with the closest power of two value, to result in the following power-of-two-coefficient metric variant of the truncated metric of Eq. (4):

$$\mu^n = \sum_{i=1}^{n} \mu_i = \sum_{i=1}^{n} \left( \sum_{j=0}^{m} (c_j dw_{i-j})^2 \right) \Bigg|_{dw=y-dz} \quad (9)$$

or its equivalent absolute metric:

$$\mu^n = \sum_{i=1}^{n} \mu_i = \sum_{i=1}^{n} \left| \sum_{j=0}^{m} c_j dw_{i-j} \right| \Bigg|_{dw=y-dz} \quad (10)$$

where $c_j$ is defined as:

$c_j = \frac{1}{2}^p$, $p \in Z$, $p \geq 0$, $0 \leq j \leq m$ $\frac{1}{2}^{(p+1)} < (1-j/(m+1)) \leq \frac{1}{2}^p$ and $$|(1-j/(m+1))-\tfrac{1}{2}^p| < |(1-j/(m+1))-\tfrac{1}{2}^{(p+1)}| \quad (11)$$

Other alternative embodiments of the power-of-two-coefficient metric are possible in which the choice of the coefficients are varied, but still using the same principle of power-of-two coefficients or some other easily implemented coefficient.

Metric Performance

Truncated Metric

The performance of the truncated metric was evaluated by software simulation of the communication system. Curves of BER (Bit-Error-Rate) versus $E_b/N_0$ (bit energy-to-noise density ratio) were obtained for different values of $E_b/N_0$. The noise density in question is that of the AWGN noise, not the correlated noise at the output of the NTSC rejection filter 201. This allows us to compare the performance of both trellis decoders, i.e. 4-state (no NTSC interference) decoder 203 and 8-state trellis decoder 202 (with NTSC interference). The performance of 4-state decoder 203, employing the Euclidean metric in the non-NTSC interference case, is considered to be a benchmark or optimal performance.

Figure 6:
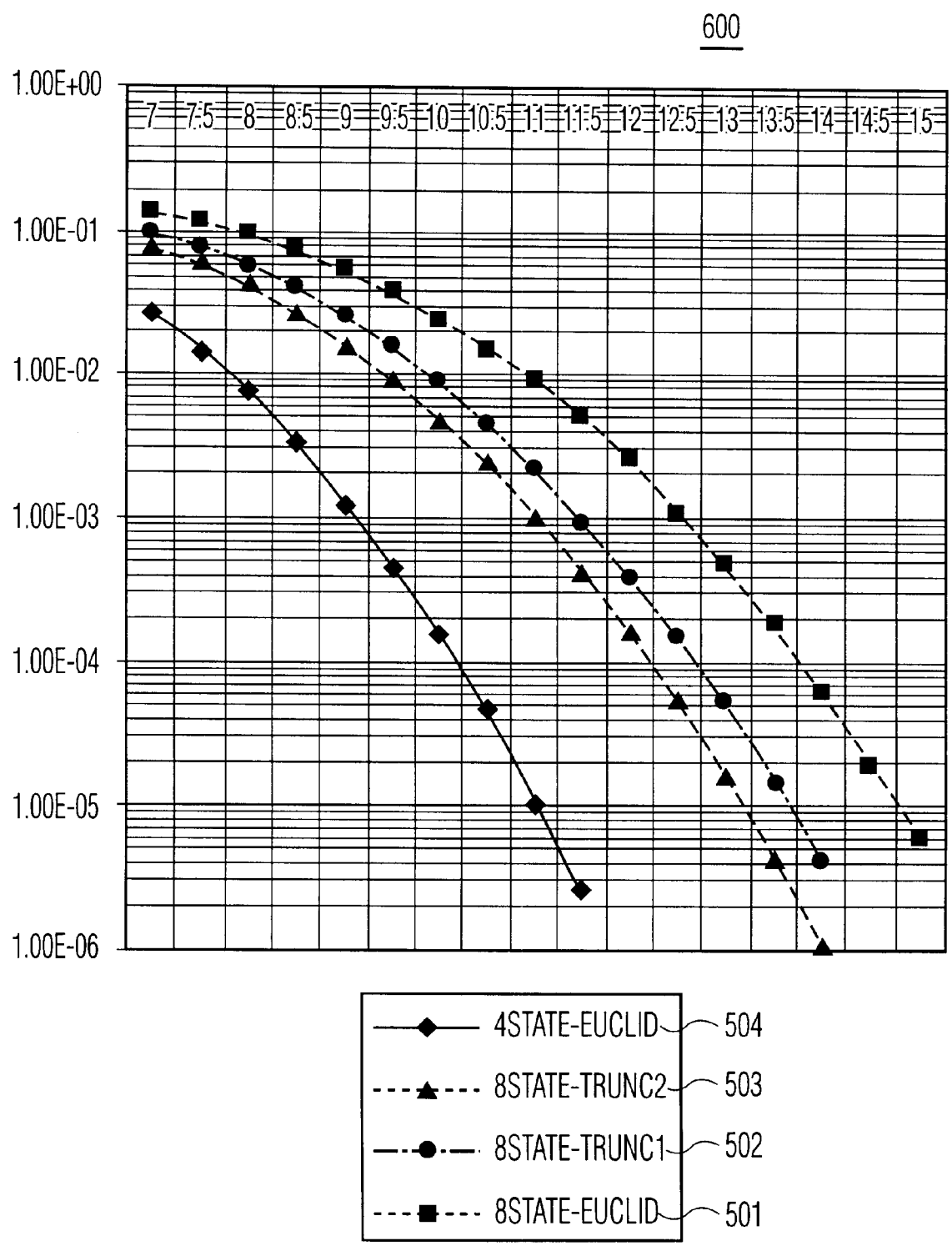
FIG. 6 is a graph plotting bit-error-rate (BER) vs. bit energy-to-noise density ratio ($E_b/N_0$) curve to illustrate the performance of the truncated trellis decoder metric of the present invention.

Referring now to FIG. 6, there is shown a graph 600 plotting BER vs. $E_b/N_0$ curves to illustrate the performance of the truncated trellis decoder metric of the present invention. In particular, graph 600 shows BER versus $E_b/N_0$ (dB) curves for the 4-state trellis decoder 203(curve 604), and for the 8-state trellis decoder 203, associated with three sub-optimum metrics (truncation constant m=0, 1, and 2). Thus, the BER versus $E_b/N_0$ curves which are illustrated for 8-state trellis decoder 202 are the performances resulting from using: the Euclidean metric (curve 601), a first truncated metric in accordance with the present invention (curve 602), and a second truncated metric in accordance with the present invention (curve 603). These curves were obtained with floating point arithmetic for the metrics, pseudo-random binary input data, Viterbi decoding with path metric storage of 25 trellis branches and at least 1000 bit errors per point.

The results plotted in FIG. 6 lead to the following conclusions about decoder performance:

(1) The 8-state trellis decoder 202 (NTSC interference case) with the Euclidean metric (the same as truncated metric of order 0, or m=0) has a performance degradation of 3.0 to 3.75 dB in the BER range of interest, with respect to the non-NTSC interference case. As explained above, this degradation is primarily due to the correlated noise after the NTSC rejection filter 201 having twice the variance of the AWGN noise in the non-NTSC interference path. This results in about 3.0 dB loss. (See the Oh et al. article, above.) Additional degradation comes from the fact that the noise is now correlated and the Euclidean metric does not take advantage of the correlation.

(2) The 8-state trellis decoder 202 with the truncated metric of order 1 (m=1) has a performance improvement over the Euclidean metric of 1.0 dB. This represents improvements in BER of up to 1 order of magnitude for the same $E_b/N_0$.

(3) The 8-state trellis decoder 203 with the truncated metric of order 2 (m=2) has a performance improvement over the Euclidean metric of 1.5 dB, representing improvements in BER of more than one order of magnitude for the same $E_b/N_0$.

Due to the law of diminishing returns, we expect additional smaller gains for higher values of the truncation constant, m. Thus, in an embodiment, for a good trade-off between gain and complexity, the values of m=1 and 2 are preferable for practical implementations of the truncated metric. However, as IC design technology advances and the cost of silicon drops, increasing values of m may become relatively easy to implement and may thus be preferred.

Absolute-Truncated Metric

Figure 7:
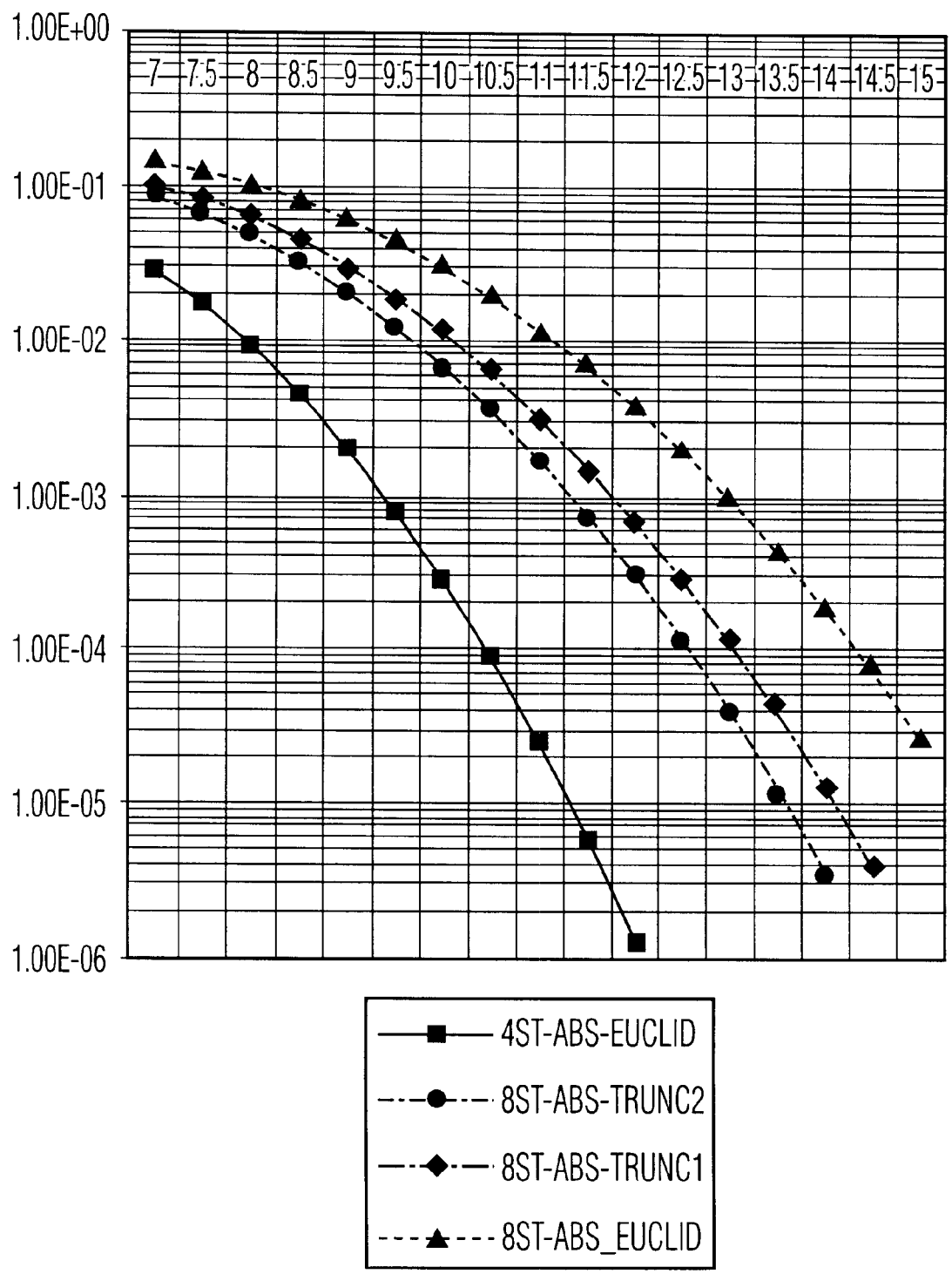
FIG. 7 is a graph plotting BER vs. $E_b/N_0$ curves to illustrate the performance of the absolute-truncated trellis decoder metric of the present invention.

Referring now to FIG. 7, there is shown a graph 700 plotting BER vs. $E_b/N_0$ curves to illustrate the performance of the absolute-truncated trellis decoder metric of the present invention, for the cases of truncation constant m=1 and 2 (curves 701 and 702, respectively), and compared to both the 4-state absolute-Euclidean metric trellis decoder (non-NTSC interference, curve 704) and 8-state absolute-Euclidean metric trellis decoder (NTSC interference, curve 701). The curves show a gain of 1.0 dB and 1.5 dB, respectively, compared to the 8-state absolute-Euclidean metric trellis decoder, showing that the relative gains are maintained when implementing absolute versions of the metrics.

Power-of-Two-Coefficient Metrics

Figure 8:
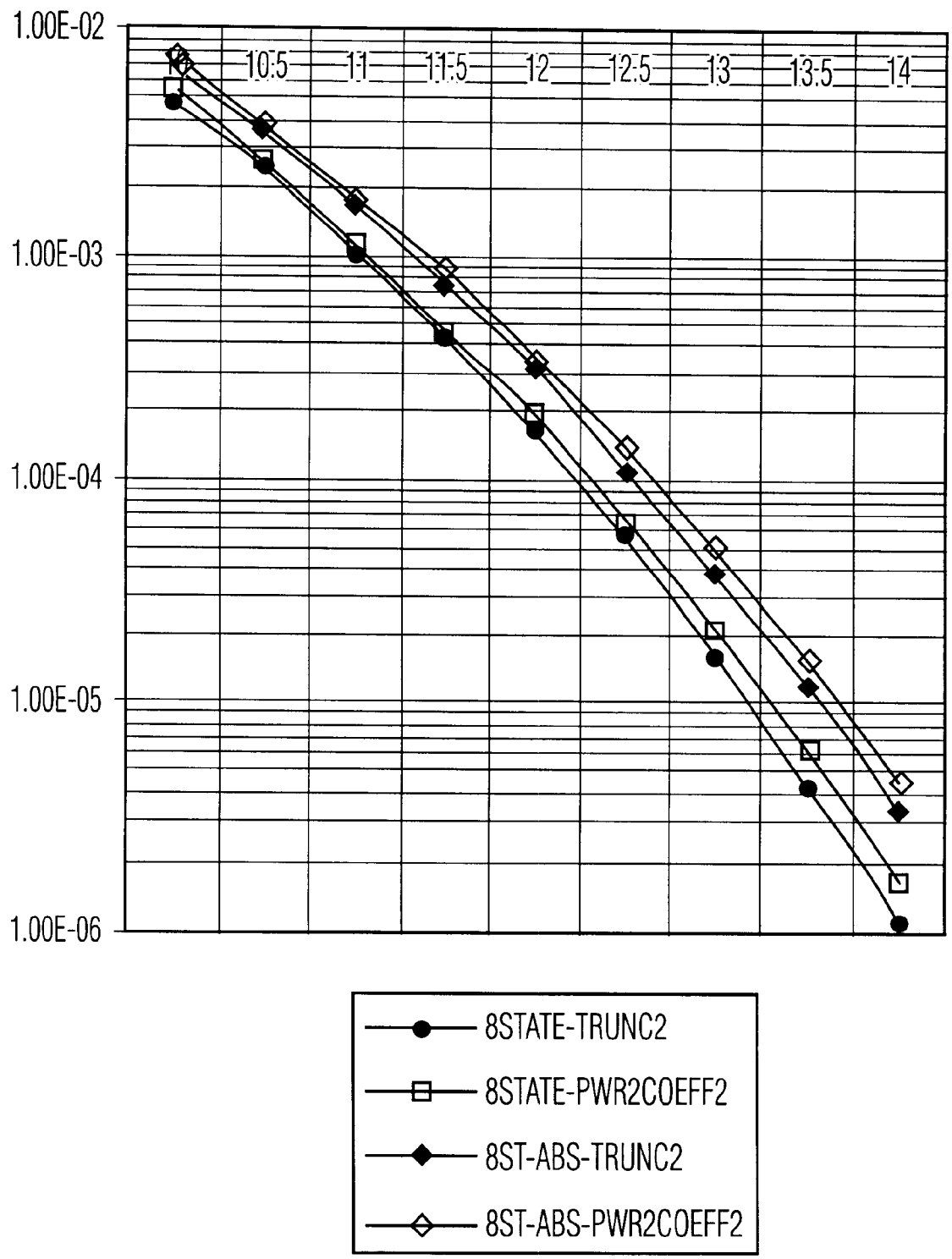
FIG. 8 is a graph plotting BER vs. $E_b/N_0$ curves to illustrate the performance of the power-of-two-coefficient and the absolute-power-of-two-coefficient trellis decoder metric of the present invention.

Referring now to FIG. 8, there is shown a graph 800 plotting BER vs. $E_b/N_0$ curves to illustrate the performance of the power-of-two-coefficient (curve 803) and the absolute-power-of-two-coefficient (curve 801) trellis decoder metric of the present invention, for the case of truncation constant m=2, and compared to both the 8-state truncated metric of order 2 (curve 804) and 8-state absolute-truncated metric of order 2 (curve 802). The curves indicate that the power-of-two-coefficient and absolute-power-of-two-coefficient metrics have basically the same performance as the corresponding truncated metrics of order 2.

Accordingly, the family of truncated metrics of the present invention provide better performance than the Euclidean metric in the NTSC co-channel interference case of the ATSC-HDTV trellis decoder. The truncated metric permits increasing gains with increased complexity. In particular, the two simplest implementations of the truncated metric permit gains of 1.0 dB and 1.5 B with respect to the Euclidean metric. These are considerable gains, which represent improvements of more than one order of magnitude in Bit-Error-Rate measurements at the output of the trellis decoder. Higher values of the metric will obtain additional gain at the expense of an added complexity.

The truncated metric trellis decoding of the present invention may be advantageously employed in systems other than ATSC-HDTV systems, for example in any system in which a trellis-encoded digital data signal needs to be demodulated, and filtered for some purpose, where the signal, if not filtered, is optimally decoded by a trellis decoder employing a Euclidean metric, and where the use of the filter transforms white noise in the demodulated isgnal into correlated noise, such that trellis decoding the filtered signal with a Euclidean metric is no longer optimal. In such a system, a complex, non-Euclidean optimal metric is determined, and a truncated version of this non-Euclidean metric is employed when trellis decoding the filtered signal.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. In a system for receiving a signal containing digital data representing high definition television (HDTV) format information in the form of multilevel symbols formatted into groups of successive fields, each field comprising a field segment, a plurality of data segments, and associated sync components, a signal processing method comprising the steps of:

(a) demodulating the received signal to produce a demodulated signal;

(b) filtering the demodulated signal to reject NTSC co-channel interference to produce a filtered signal; and (c) trellis decoding the filtered signal with a trellis decoder employing a truncated non-Euclidean metric.

2. The method of claim 1, wherein the received signal is a Vestigial SideBand (VSB) modulated signal.

3. The method of claim 1, wherein the filtering step includes comb filtering the demodulated signal.

4. The method of claim 1, wherein:

step (a) comprises the step of demodulating the received signal with a demodulator;

step (b) comprises the steps of:
   (1) detecting, with the demodulator, NTSC co-channel interference; and
   (2) filtering the demodulated signal with a comb filter of the demodulator only if NTSC co-channel interference is detected by the demodulator; and step (c) comprises the step of trellis decoding the filtered signal with a partial response trellis decoder employing a truncated non-Euclidean metric if NTSC co-channel interference is detected by the demodulator and otherwise trellis decoding the demodulated signal with an optimal trellis decoder employing a Euclidean metric.

5. The method of claim 4, wherein the partial response trellis decoder is an 8-state partial response trellis decoder and the optimal trellis decoder is a 4-state optimal trellis decoder.

6. The method of claim 5, wherein the partial response trellis decoder and the optimal trellis decoder are implemented by a trellis decoder having 12 identical decoders for performing 12 decoder interleaving.

7. The method of claim 1, wherein the truncated metric is an absolute-truncated metric.

8. The method of claim 1, wherein the truncated metric is a power-of-two-coefficient metric.

9. The method of claim 8, wherein the power-of-two-coefficient metric is an absolute-power-of-two-coefficient metric.

10. In a system for receiving a signal containing digital data representing high definition television (HDTV) format information in the form of multilevel symbols formatted into groups of successive fields, each field comprising a field segment, a plurality of data segments, and associated sync components, a signal processing method comprising the steps of:

(a) demodulating the received signal to produce a demodulated signal;

(b) filtering the demodulated signal to reject NTSC co-channel interference to produce a filtered signal; and (c) trellis decoding the filtered signal with a trellis decoder employing a truncated non-Euclidean metric, wherein an optimal metric to be used by the trellis decoder when there is NTSC interference and the filtering of step (b) is an optimal non-Euclidean metric associated with a product of conditional probability density functions of filtered noise samples, wherein the truncated metric is a truncated version of the optimal non-Euclidean metric in which the conditional PDFs of the optimal non-Euclidean metric are truncated to a finite small number of previous samples, m, upon which the condition applies.

11. In a system for receiving a signal containing digital data representing high definition television (HDTV) formal information in the form of multilevel symbols formatted into groups of successive fields, each field comprising a field segment, a plurality of data segments, and associated sync components, a signal processing method comprising the steps of:

(a) demodulating the received signal to produce a demodulated signal;

(b) filtering the demodulated signal to reject NTSC co-channel interference to produce a filtered signal; and (c) trellis decoding the filtered signal with a trellis decoder employing a truncated non-Euclidean metric, wherein, for a general value of the truncation metric, m, the truncated metric is given by the following formula:

$$\mu^n = \sum_{i=1}^{n} \mu_i = \sum_{i=1}^{n} \left( \sum_{j=0}^{m} (1 - j/(m+1)) dw_{i-j} \right)^2 \Bigg|_{dw=y-dz}$$

where n is the sequence length; m is the truncation constant (m#n); y is the received partial response symbol plus correlated noise; dz is the partial response symbol; dw is the correlated noise, and $dw_{-m+1} = \ldots = dw_{-1} = dw_0/0$.

12. The method of claim 11, wherein m=1.

13. The method of claim 12, wherein m=2.

14. In a system for receiving a trellis encoded signal containing digital data, a signal processing method comprising the steps of:

(a) demodulating the received signal to produce a demodulated signal having white noise, wherein the demodulated signal having white noise can be optimally trellis decoded by trellis decoding the signal employing a Euclidean metric;

(b) filtering the demodulated signal to produce a filtered signal, wherein the filtering transforms the white noise of the signal into correlated noise; and (c) trellis decoding the filtered signal with a trellis decoder employing a truncated non-Euclidean metric.

* * * * *